United States Patent
Wang et al.

(10) Patent No.: US 11,696,509 B2
(45) Date of Patent: Jul. 4, 2023

(54) FLEXIBLE ELECTRIC GENERATOR FOR GENERATING ELECTRIC POWER

(71) Applicant: Nano and Advanced Materials Institute Limited, Hong Kong (CN)

(72) Inventors: Han Wang, Hong Kong (CN); Qingyi Yang, Hong Kong (CN); Jianjun Song, Hong Kong (CN); Kwok Keung Paul Ho, Hong Kong (CN); Jifan Li, Hong Kong (CN)

(73) Assignee: Nano and Advanced Materials Institute Limited, Hong Kong (CN)

( * ) Notice: Subject to any disclaimer, the term of this patent is extended or adjusted under 35 U.S.C. 154(b) by 809 days.

(21) Appl. No.: 16/693,977

(22) Filed: Nov. 25, 2019

(65) Prior Publication Data
US 2020/0168788 A1    May 28, 2020

Related U.S. Application Data

(60) Provisional application No. 62/917,170, filed on Nov. 26, 2018.

(51) Int. Cl.
*H01L 41/18* (2006.01)
*H01L 41/113* (2006.01)
(Continued)

(52) U.S. Cl.
CPC ......... *H10N 30/852* (2023.02); *H10N 30/092* (2023.02); *H10N 30/30* (2023.02)

(58) Field of Classification Search
CPC ....... H01L 41/37; H01L 41/113; H01L 41/183
(Continued)

(56) References Cited

U.S. PATENT DOCUMENTS

| 8,803,406 B2 | 8/2014 | Lee et al. |
| 9,444,031 B2 | 9/2016 | Park et al. |

(Continued)

FOREIGN PATENT DOCUMENTS

| CN | 202679272 U | 1/2013 |
| CN | 203377812 U | 1/2014 |

(Continued)

OTHER PUBLICATIONS

Park et al.; Flexible and Large—Area Nanocomposite Generators Based on Lead Zirconate Titanate Particles and Carbon Nanotubes; Advanced Energy Materials; Dec. 2013; pp. 1359-1544; vol. 3; Wiley.

(Continued)

*Primary Examiner* — Shawki S Ismail
*Assistant Examiner* — Monica Mata
(74) *Attorney, Agent, or Firm* — Spruson & Ferguson (Hong Kong) Limited

(57) ABSTRACT

The present disclosure provides a flexible electric generator and methods for fabricating the same. The flexible electric generator comprises a flexible triboelectric layer covering the electrode layer of a flexible piezoelectric generator that enhances output power by combining piezoelectric effect and triboelectric effect. The reliability of the flexible electric generator under bending is also improved due to the presence of the flexible triboelectric layer. The fabrication methods of the disclosed flexible electric generators are simple, thereby enabling large-scale manufacturing.

19 Claims, 15 Drawing Sheets

(51) Int. Cl.
*H01L 41/37* (2013.01)
*H10N 30/85* (2023.01)
*H10N 30/30* (2023.01)
*H10N 30/092* (2023.01)

(58) Field of Classification Search
USPC .......................................................... 310/339
See application file for complete search history.

(56) References Cited

U.S. PATENT DOCUMENTS

2012/0133247 A1   5/2012  Lee et al.
2015/0061464 A1*  3/2015  Park ......................... H02N 1/04
                                                         310/329
2020/0204089 A1*  6/2020  Mahmud ............. H01L 41/0815

FOREIGN PATENT DOCUMENTS

CN   105871247 A   8/2016
CN   206323320 U   7/2017

OTHER PUBLICATIONS

Office Action of CN201911218367X issued from the China National Intellectual Property Administration dated Nov. 5, 2022.

* cited by examiner

FLEXIBLE ELECTRIC GENERATOR FOR GENERATING ELECTRIC POWER

CROSS-REFERENCE TO RELATED APPLICATIONS

This application claims the benefit of U.S. Provisional Patent Application No. 62/917,170, filed on 26 Nov. 2018, which is incorporated by reference herein in its entirety.

TECHNICAL FIELD

The present disclosure generally relates to an electric generator, more particularly, relates to a flexible electric generator and methods for fabricating the same.

BACKGROUND ART

Recently, flexible electric generators using piezoelectric materials have been widely studied, aiming to be applied as force sensors or energy harvesters. The force sensitivity, the generated output power, device lifetime and large scale fabrication are major concerns. The flexible piezoelectric generator is a good candidate for wearable electronic devices.

Commercial flexible PVDF based thin films have been applied as force sensors in high-end product but the cost is very high. Furthermore, due to its low piezoelectric coefficient, PVDF is hard to be utilized as an energy harvester.

The piezoelectric generators modified via nanostructure perform good energy harvesting capability but the complicated fabrication process and poor reliability cannot be easily applied to industrial production.

U.S. Pat. No. 8,803,406B2 disclosed a flexible nanocomposite generator including a piezoelectric layer formed of a flexible matrix containing piezoelectric nanoparticles and carbon nanostructures; and electrode layers disposed on the top and bottom surfaces of both sides of the piezoelectric layer, providing the possibility to manufacture a flexible generator with a large area and a small thickness. However, the generated power is very limited and the reliability is poor due to the peeling of the electrode layers during bending.

A need therefore exists for a flexible electric generator to eliminate or at least diminish the disadvantages and problems described above.

SUMMARY OF THE INVENTION

Provided herein is an electric generator comprising: a piezoelectric generator comprising: a flexible piezoelectric layer for generating a first electric power via piezoelectric effect under contact between the electric generator and a first surface contact object; a first flexible dielectric layer partially or fully covering a top surface of the flexible piezoelectric layer; a second flexible dielectric layer partially or fully covering a bottom surface of the flexible piezoelectric layer; a first flexible electrode layer comprising a first covering portion partially or fully covering a top surface of the first flexible dielectric layer; and a second flexible electrode layer comprising a second covering portion partially or fully covering a bottom surface of the second flexible dielectric layer; and a first flexible triboelectric layer partially or fully covering a top surface of the first covering portion of the first flexible electrode layer for generating a second electric power via triboelectric effect under contact and separation between the first flexible triboelectric layer and the first surface contact object.

In certain embodiments, the electric generator further comprises a second flexible triboelectric layer partially or fully covering a bottom surface of the second covering portion of the second flexible electrode layer for generating a third electric power via triboelectric effect under contact and separation between the second flexible triboelectric layer and a second surface contact object.

In certain embodiments, the first flexible triboelectric layer has negative electronegativity.

In certain embodiments, the first flexible triboelectric layer has a charge affinity value between −1 nC/J and −200 nC/J.

In certain embodiments, the first flexible triboelectric layer comprises a polymer, an electrostatic textile, or a cellulose-based material.

In certain embodiments, the polymer is silicone, polyimide, polyurethane, rubber, polyester, or nylon, the electrostatic textile is an electrostatic fabric, or an electrostatic cloth, the cellulose-based material is a paper.

In certain embodiments, the first flexible triboelectric layer is porous.

In certain embodiments, the porous first flexible triboelectric layer has porosity between 10% and 80%, each pore of the porous first flexible triboelectric layer has a diameter between 0.1 μm and 100 μm.

In certain embodiments, the electric generator further comprises a partial flexible electrode partially covering a top surface of the first flexible triboelectric layer.

In certain embodiments, the partial flexible electrode covers an area between 1% and 50% of a total area of the top surface of the first flexible triboelectric layer.

In certain embodiments, the electric generator further comprises a stereo-structured packaging layer comprising one or more concave flexible electrodes, each concave flexible electrode partially covering a top surface of the first flexible triboelectric layer in a way that empty space is present between the concave flexible electrode and the first flexible triboelectric layer.

In certain embodiments, the empty space has a height between 0.3 mm and 5.0 mm.

In certain embodiments, the stereo-structured packaging layer further comprises a polymer layer covering a top surface of the one or more concave flexible electrodes.

In certain embodiments, the flexible piezoelectric layer comprises a polymer matrix, an inorganic piezoelectric material and an electrical conducting material.

In certain embodiments, each of the first flexible dielectric layer and the second flexible dielectric layer comprises silicone.

In certain embodiments, the first flexible electrode layer further comprises a first protruding portion protruding from the top surface of the first flexible dielectric layer for providing a first ohmic contact to a load, and the second flexible electrode layer further comprises a second protruding portion protruding from the bottom surface of the second flexible dielectric layer for providing a second ohmic contact to the load.

In certain embodiments, each of the first flexible electrode layer and second flexible electrode layer comprises a conductive fabric, a conductive sponge, a metal foil, or a metal mesh.

Provided herein is system for generating electric power comprising: the electric generator described above; and a surface contact object for contacting the electric generator to generate electric power.

In certain embodiments, the first flexible triboelectric layer has negative electronegativity, the surface contact object has positive electronegativity.

In certain embodiments, the first flexible triboelectric layer has a charge affinity value between −1 nC/J and −200 nC/J, and the surface contact object has a charge affinity value between +3 nC/J and +60 nC/J.

These and other aspects, features and advantages of the present disclosure will become more fully apparent from the following brief description of the drawings, the drawings, the detailed description of certain embodiments and appended claims.

BRIEF DESCRIPTION OF DRAWINGS

The appended drawings contain figures of certain embodiments to further illustrate and clarify the above and other aspects, advantages and features of the present invention. It will be appreciated that these drawings depict embodiments of the invention and are not intended to limit its scope. The invention will be described and explained with additional specificity and detail through the use of the accompanying drawings in which.

DETAILED DESCRIPTION OF THE INVENTION

The present disclosure discloses an electric generator for electric power generation. The electric generator utilizes piezoelectric effect and triboelectric effect to generate voltage and current from the applied mechanical force and contact electrification. The electric generator comprises a triboelectric layer covering an electrode of a piezoelectric generator to induce additional triboelectric effect. The electric generator can be used for force sensing or energy harvesting. By using the present electric generator, the force sensitivity can be improved with a wide force sensing range, e.g., from 0.01 N to 5000 N, and the generated power can be increased with, e.g., at least five times comparing with the conventional piezoelectric generator without the triboelectric layer.

Figure 1:
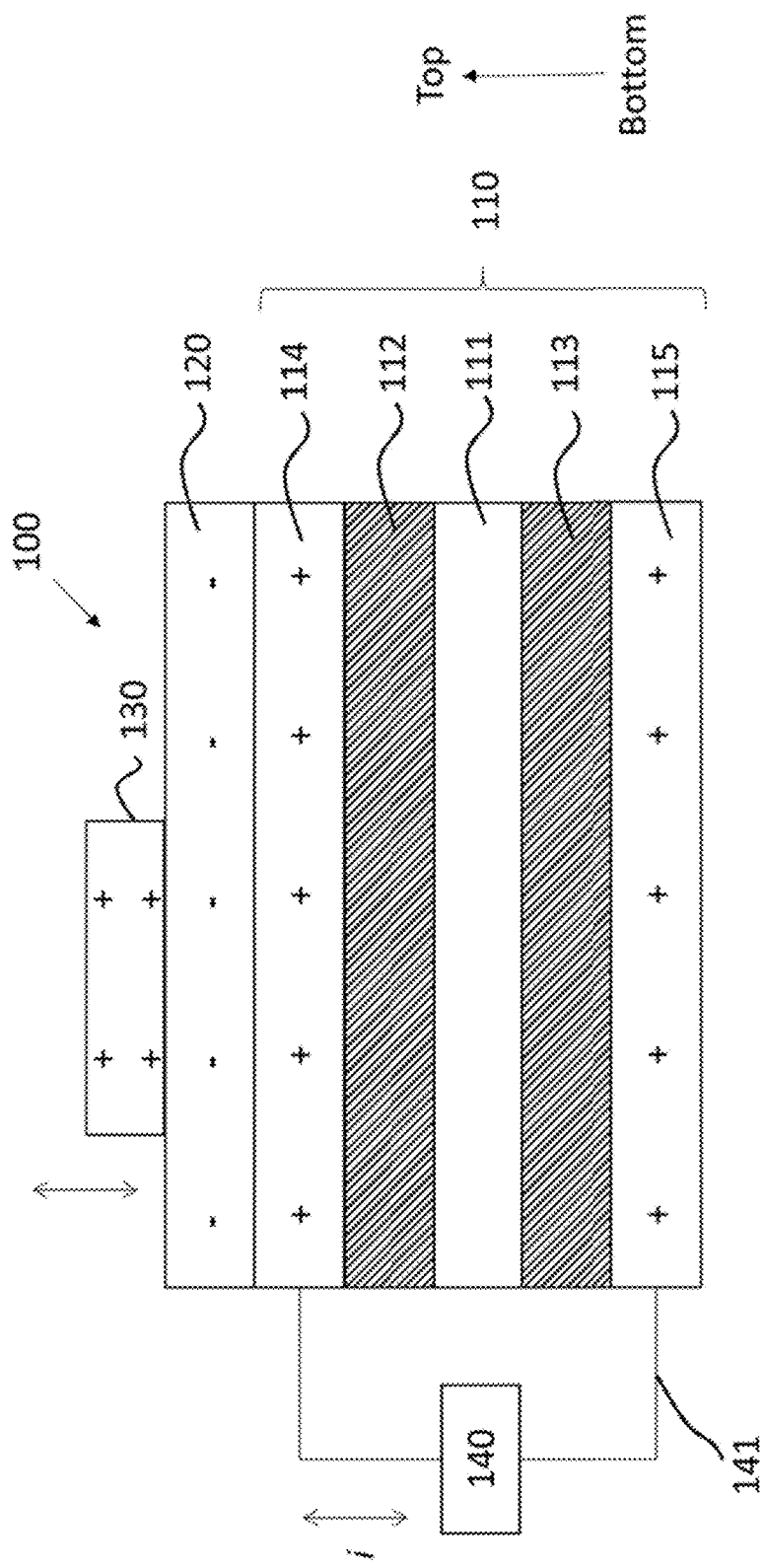
FIG. 1 is a schematic diagram depicting a cross section of an electric generator according to certain embodiments.

FIG. 1 is a schematic diagram depicting a cross section of an electric generator according to certain embodiments. The electric generator 100 comprises a piezoelectric generator 110 and a flexible triboelectric layer 120. The piezoelectric generator 110 comprises a flexible piezoelectric layer 111, a first flexible dielectric layer 112, a second flexible dielectric layer 113, a first flexible electrode layer 114 and a second flexible electrode layer 115. The flexible piezoelectric layer 111 generates a first electric power via piezoelectric effect under contact between the electric generator 100 and a surface contact object 130. The first flexible dielectric layer 112 covers a top surface of the flexible piezoelectric layer 111. The second flexible dielectric layer 113 covers a bottom surface of the flexible piezoelectric layer 111. The first flexible dielectric layer 112 and the second flexible dielectric layer 113 provide electrical polarization of the flexible piezoelectric layer 111 to achieve piezoelectric effect. The first flexible electrode layer 114 covers a top surface of the first flexible dielectric layer 112. The second flexible electrode layer 115 covers a bottom surface of the second flexible dielectric layer 113. The flexible triboelectric layer 120 covers a top surface of the first flexible electrode layer 114 for generating a second electric power via triboelectric effect under contact and separation between the flexible triboelectric layer 120 and the surface contact object 130. The electrical charges generated by the by the flexible piezoelectric layer 111 and the flexible triboelectric layer 120 in the first flexible electrode layer 114 and the second flexible electrode layer 115 are transferred to a load 140 via electrical wires 141.

In certain embodiments, the flexible triboelectric layer has opposite electronegativity with that of the surface contact object. The material of the flexible triboelectric layer becomes electrically charged after they come into frictional contact with the surface contact object. The surface contact object can be human's bare skin having positive electronegativity, a metal tool, a plastic ball, or water drop.

In certain embodiments, the first flexible triboelectric layer has negative electronegativity.

In certain embodiments, the flexible triboelectric layer has a charge affinity value between −1 nC/J and −200 nC/J.

In certain embodiments, the flexible triboelectric layer comprises a polymer, an electrostatic textile, or a cellulose-based material. The polymer can be silicone, polyimide, polyurethane, rubber, polyester, or nylon. The electrostatic textile can be an electrostatic fabric or an electrostatic cloth. The cellulose-based material can be a paper.

In certain embodiments, the flexible triboelectric layer has a thickness between 30 μm and 200 μm, between 60 μm and 170 μm, or between 90 μm and 140 μm.

In certain embodiments, the flexible piezoelectric layer comprises an inorganic piezoelectric ceramic powder and/or an organic piezoelectric material, an electrical conducting material and a polymer matrix. The inorganic piezoelectric ceramic powder and the organic piezoelectric material generate electric power via piezoelectric effect. The electrical conducting material provides electrical conducting paths within the flexible piezoelectric layer. The polymer matrix provides the flexibility of the flexible piezoelectric layer.

In certain embodiments, the inorganic piezoelectric ceramic powder comprises barium titanate, lead zirconate titanate, potassium niobate, sodium tungstate, zinc oxide (e.g., in Wurtzite structure), bismuth ferrite, or bismuth titanate. The inorganic piezoelectric ceramic powder can be calcined for preliminary crystallization.

In certain embodiments, the inorganic piezoelectric ceramic powder has a particle size between 10 nm and 5 μm.

In certain embodiments, the inorganic piezoelectric ceramic powder has a weight ratio to the total composite between 10% and 70%.

In certain embodiments, the organic piezoelectric material is polyvinylidene fluoride (PVDF) based fiber. In certain embodiments, the organic piezoelectric material has a weight ratio to the total composite between 1% and 30%.

In certain embodiments, the electrical conducting material is a carbon based material (e.g., single-walled carbon nanotube, multi-walled carbon nanotube, graphene, or graphite), or a metallic material (e.g., silver nanowire).

In certain embodiments, the electrical conducting material has a weight ratio to the total composite between 0.3% and 10%.

In certain embodiments, the polymer matrix is a solid elastomer.

In certain embodiments, the polymer matrix is silicone. The hardness of silicone can range from Shore A 5 degree to shore A 50 degree. The silicone can be transparent or semi-transparent or opaque.

In certain embodiments, the polymer matrix has a weight ratio to the total composite between 30% and 90%.

In certain embodiments, the polymer matrix, the inorganic piezoelectric ceramic powder and/or the organic piezoelectric fiber, as well as the electrical conducting materials are mixed via ultrasonic dispersion, mechanical stirring or vacuum mixer to form homogeneous slurry. A diluent (e.g., methanol, ethanol, IPA, hexane, toluene, or xylene) can be used to reduce the viscosity of the slurry if necessary. The slurry can be cured to form the flexible piezoelectric layer.

In certain embodiments, the flexible piezoelectric layer has a thickness between 10 μm and 200 μm.

In certain embodiments, the first flexible dielectric layer and the second flexible dielectric layer partially cover the top surface and the bottom surface of the flexible piezoelectric layer respectively.

In certain embodiments, the first flexible dielectric layer and the second flexible dielectric layer fully cover the top surface and the bottom surface of the flexible piezoelectric layer respectively. That can help to avoid electrical breakdown during polarization process.

In certain embodiments, each of the first flexible dielectric layer and the second flexible dielectric layer comprises a polymer. The polymer can be silicone (e.g., PDMS).

In certain embodiments, each of the first flexible dielectric layer and the second flexible dielectric layer has a thickness between 10 μm to 100 μm.

In certain embodiments, the first flexible electrode layer and the second flexible electrode layer partially cover the top surface of the first flexible dielectric layer and the bottom surface of the second flexible dielectric layer respectively.

In certain embodiments, the first flexible electrode layer and the second flexible electrode layer fully cover the top surface of the first flexible dielectric layer and the bottom surface of the second flexible dielectric layer respectively. That can enhance the generation of electric power.

In certain embodiments, each of the first flexible electrode layer and the second flexible electrode layer comprises a conductive fabric, a conductive sponge, a metal foil, or a metal mesh. The conductive fabric can be a polyester fiber deposited with nickel and copper, a polyester mesh deposited with nickel and copper, or a silver fabric. The conductive sponge can be a polyester sponge deposited with nickel and copper. The metal foil can be an aluminum foil, a copper foil, or a stainless steel foil.

In certain embodiments, each of the first flexible electrode layer and the second flexible electrode layer has a thickness between 1 μm to 200 μm.

In certain embodiments, the flexible triboelectric layer partially covers the top surface of the first flexible electrode layer.

In certain embodiments, the flexible triboelectric layer fully covers the top surface of the first flexible electrode layer. That can enhance the generation of electric power.

In certain embodiments, the electric generator has a surface area between 0.16 $cm^2$ and 1000 $cm^2$, and a minimum thickness of about 60 μm. The electric generator can be bent with a very small radius, e.g., less than 1 cm.

Figure 2A:
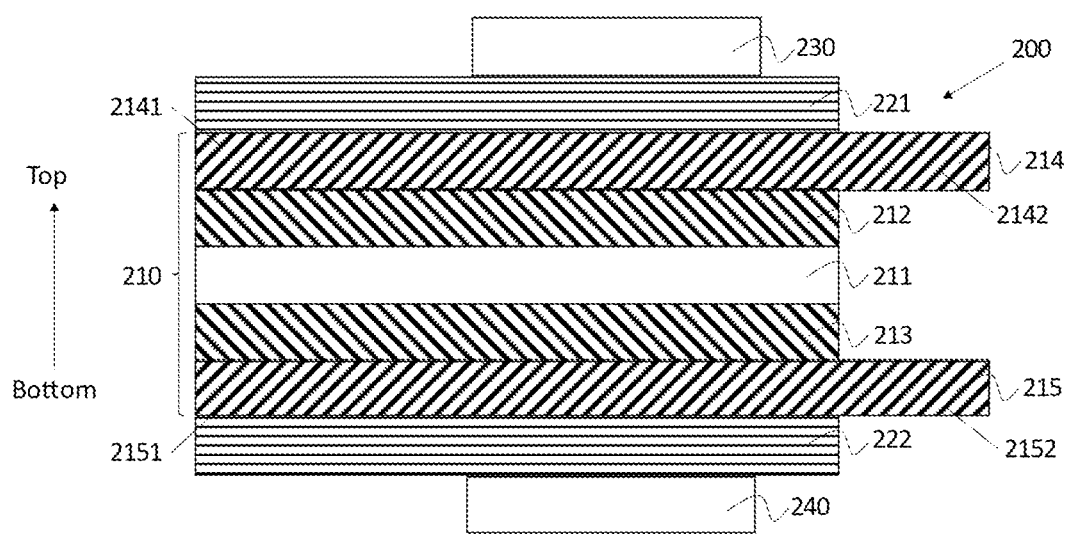
FIG. 2A is a schematic diagram depicting a cross section of an electric generator with a pair of flexible triboelectric layers according to certain embodiments.
Figure 2B:
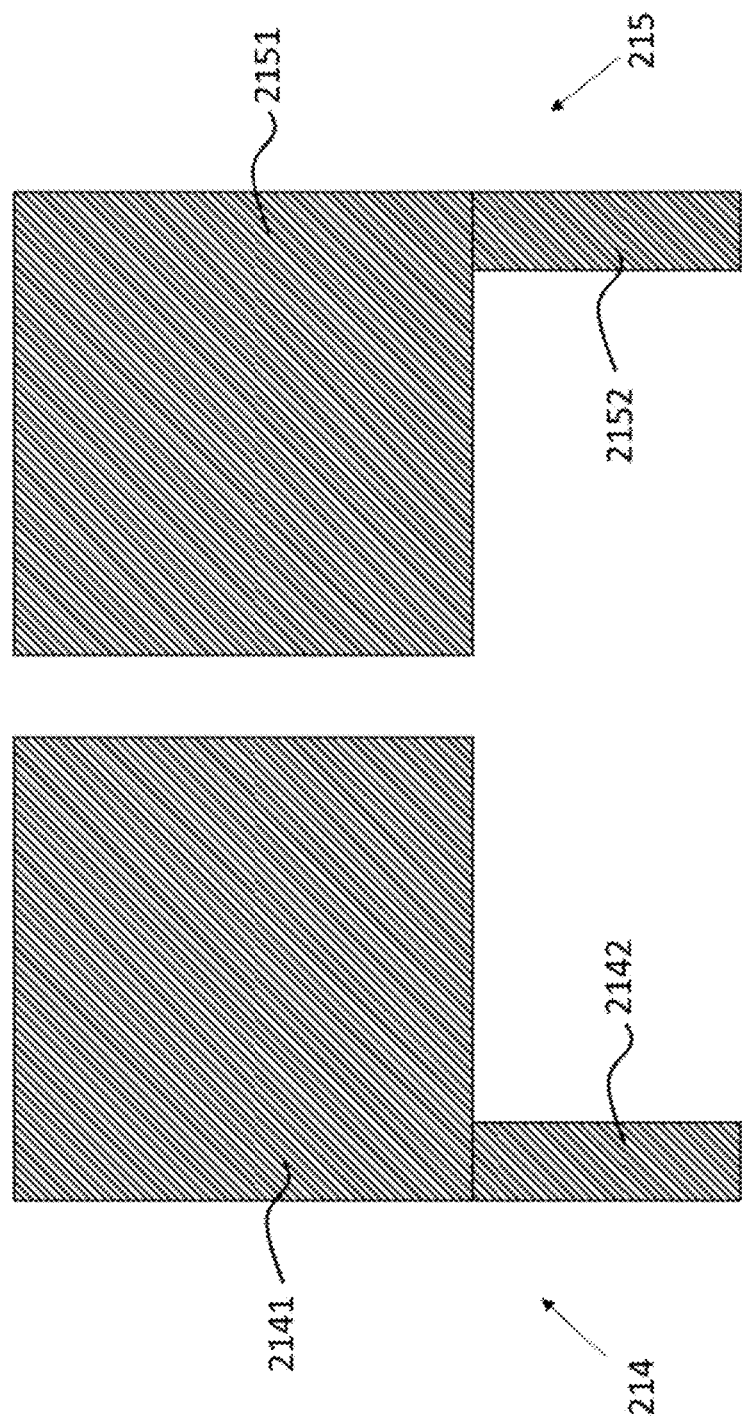
FIG. 2B is a schematic diagram depicting the top view of the first flexible electrode layer and the second flexible electrode layer of the electric generator of FIG. 2A.
Figure 2C:
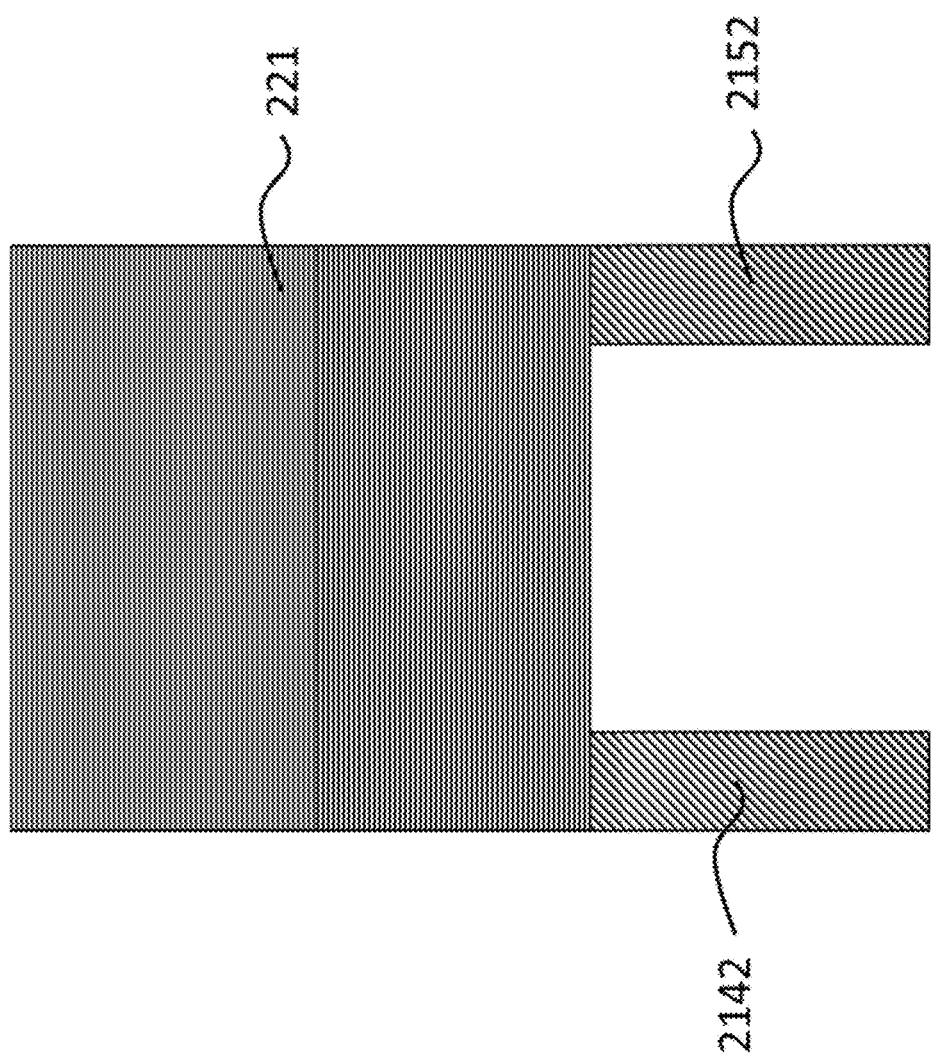
FIG. 2C is a schematic diagram depicting the top view of the electric generator of FIG. 2A.

FIG. 2A is a schematic diagram depicting a cross section of an electric generator with a pair of flexible triboelectric layers according to certain embodiments. The electric generator 200 comprises a piezoelectric generator 210, a first flexible triboelectric layer 221 and a second flexible triboelectric layer 222. The piezoelectric generator 210 comprises a flexible piezoelectric layer 211, a first flexible dielectric layer 212, a second flexible dielectric layer 213, a first flexible electrode layer 214 and a second flexible electrode layer 215. The first flexible dielectric layer 212 covers a top surface of the flexible piezoelectric layer 211. The second flexible dielectric layer 213 covers a bottom surface of the flexible piezoelectric layer 211. The first flexible electrode layer 214 comprises a first covering portion 2141 and a first protruding portion 2142 (also shown in FIGS. 2B and 2C). The first covering portion 2141 covers a top surface of the first flexible dielectric layer 212 and the first protruding portion 2142 protrudes from the top surface of the first flexible dielectric layer 212 for providing a first ohmic contact to a load. The second flexible electrode layer 215 comprises a second covering portion 2151 and a second protruding portion 2152 (also shown in FIGS. 2B and 2C). The second covering portion 2151 covers a bottom surface of the second flexible dielectric layer 213 and the second protruding portion 2152 protrudes from the bottom surface of the second flexible dielectric layer 213 for providing a second ohmic contact to the load. The first flexible triboelectric layer 221 covers a top surface of the first covering portion 2141. The second flexible triboelectric layer 222 covers a bottom surface of the second covering portion 2151. As both sides of the electric generator 200 have the first flexible triboelectric layer 221 and the second flexible triboelectric layer 222 respectively, the electric generator 200 can generate electric power via triboelectric effect on both sides between the first flexible triboelectric layer 221 and a first surface contract object 230, and between the second flexible triboelectric layer 222 and a second surface contact object 240, respectively, thereby enhancing the generation of electric power.

Figure 3A:
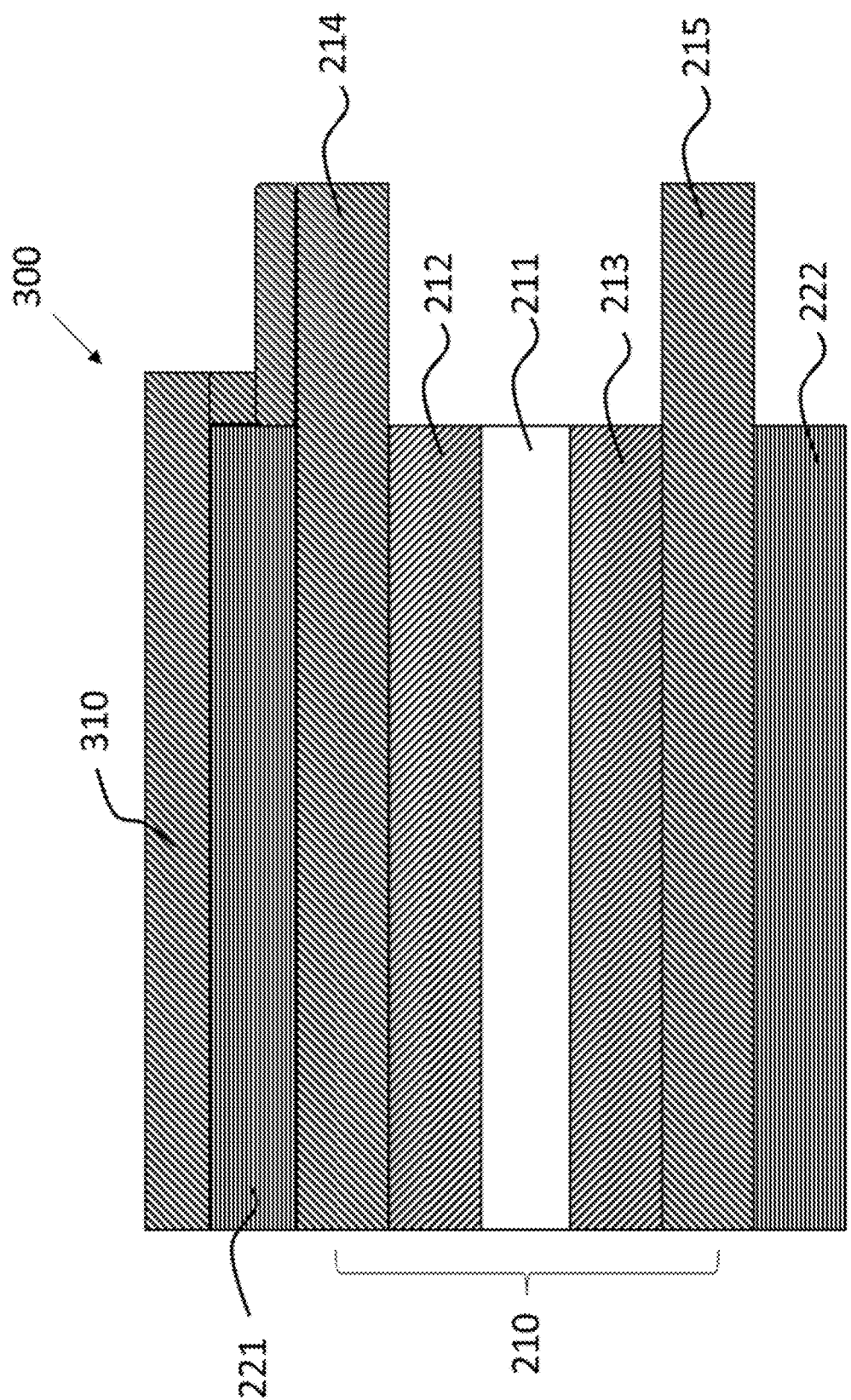
FIG. 3A is a schematic diagram depicting a cross section of an electric generator with a partial flexible electrode according to certain embodiments.
Figure 3B:
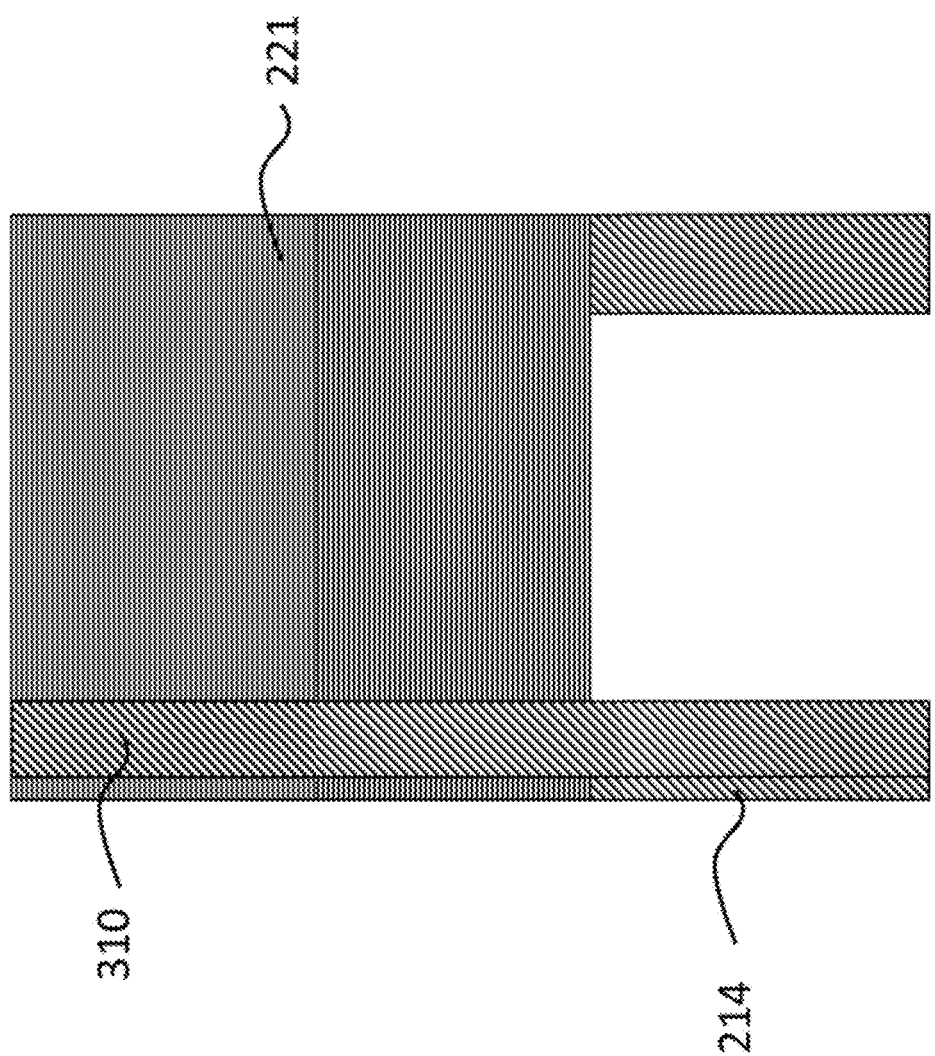
FIG. 3B is a schematic diagram depicting the top view of the electric generator of FIG. 3A.

FIG. 3A is a schematic diagram depicting a cross section of an electric generator with a partial flexible electrode according to certain embodiments. The electric generator 300 is substantially similar to the electric generator 200 of FIG. 2A except that the electric generator 300 further comprises a partial flexible electrode 310. The partial flexible electrode 310 partially covers a top surface of the first flexible triboelectric layer 221 and forms an ohmic contact with the first flexible electrode layer 214 as shown in FIG. 3B. The partial flexible electrode 310 can enhance the efficiency in collecting and exporting the electric power generated via triboelectric effect.

In certain embodiments, the partial flexible electrode is a conductive fabric, a conductive sponge, a metal foil, or a metal mesh.

In certain embodiments, the partial flexible electrode covers an area between 1% and 50% of a total area of the top surface of the first flexible triboelectric layer.

Figure 4A:
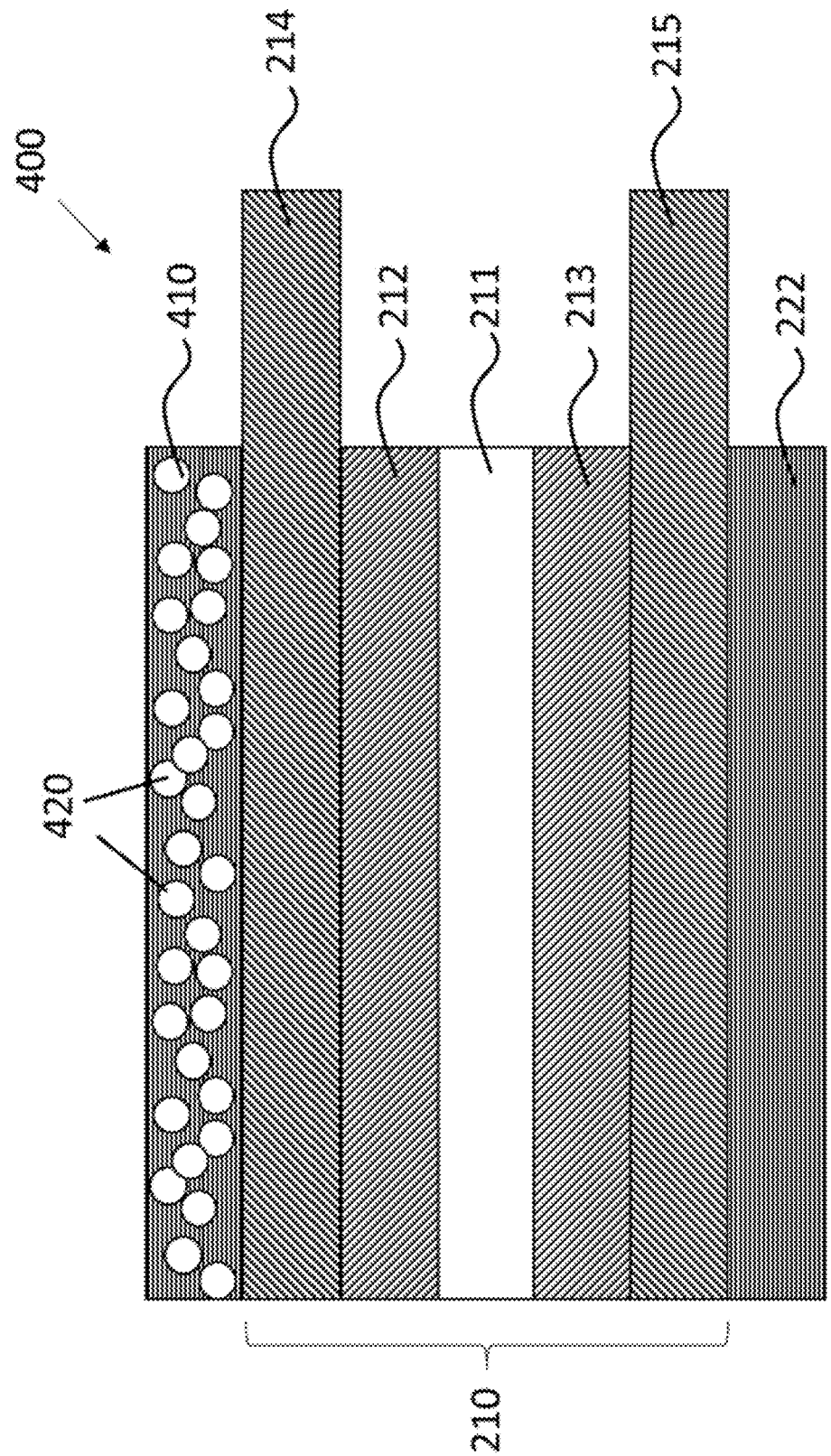
FIG. 4A is a schematic diagram depicting a cross section of an electric generator with a porous flexible triboelectric layer according to certain embodiments.

FIG. 4A is a schematic diagram depicting a cross section of an electric generator with a porous flexible triboelectric layer according to certain embodiments. The electric generator 400 is substantially similar to the electric generator 200 of FIG. 2A except that the first flexible triboelectric layer 221 is replaced with a porous flexible triboelectric layer 410. The porous flexible triboelectric layer 410 includes a plurality of pores 420 within the layer 410 that can enhance the triboelectric effect to generate more electric power.

In certain embodiments, the porous flexible triboelectric layer has porosity between 10% and 80%. In certain embodiments, each pore of the porous flexible triboelectric layer has a diameter between 0.1 μm and 100 μm.

In certain embodiments, the porous flexible triboelectric layer has a thickness between 80 μm and 200 μm.

In certain embodiments, the porous flexible triboelectric layer is achieved through adding a foaming agent into a polymer film precursor. The foaming agent can be N-(3-triethoxysilylpropyl)ethylenediamine, (3-glycidyloxypropyl)triethoxysilane, 3-[2-(2-aminoethylamino)ethylamino] propyl-trimethoxysilane, phenyltriethoxysilane, or methyl methacrylate.

Figure 4B:
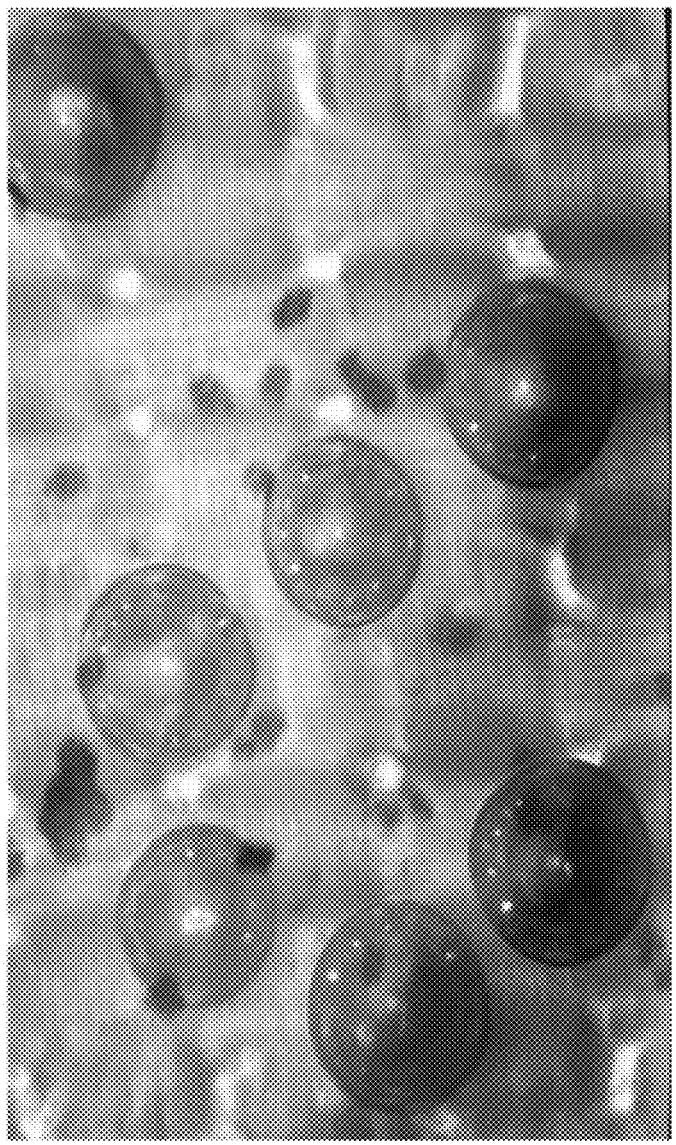
FIG. 4B is an image of a porous PDMS layer of an electric generator according to certain embodiments.

FIG. 4B is an image of a porous silicone layer according to certain embodiments. The porous silicone layer was prepared by adding phenyltriethoxysilane in silicone resulted in generation of bubbles with a diameter of about 100 μm.

Figure 5:
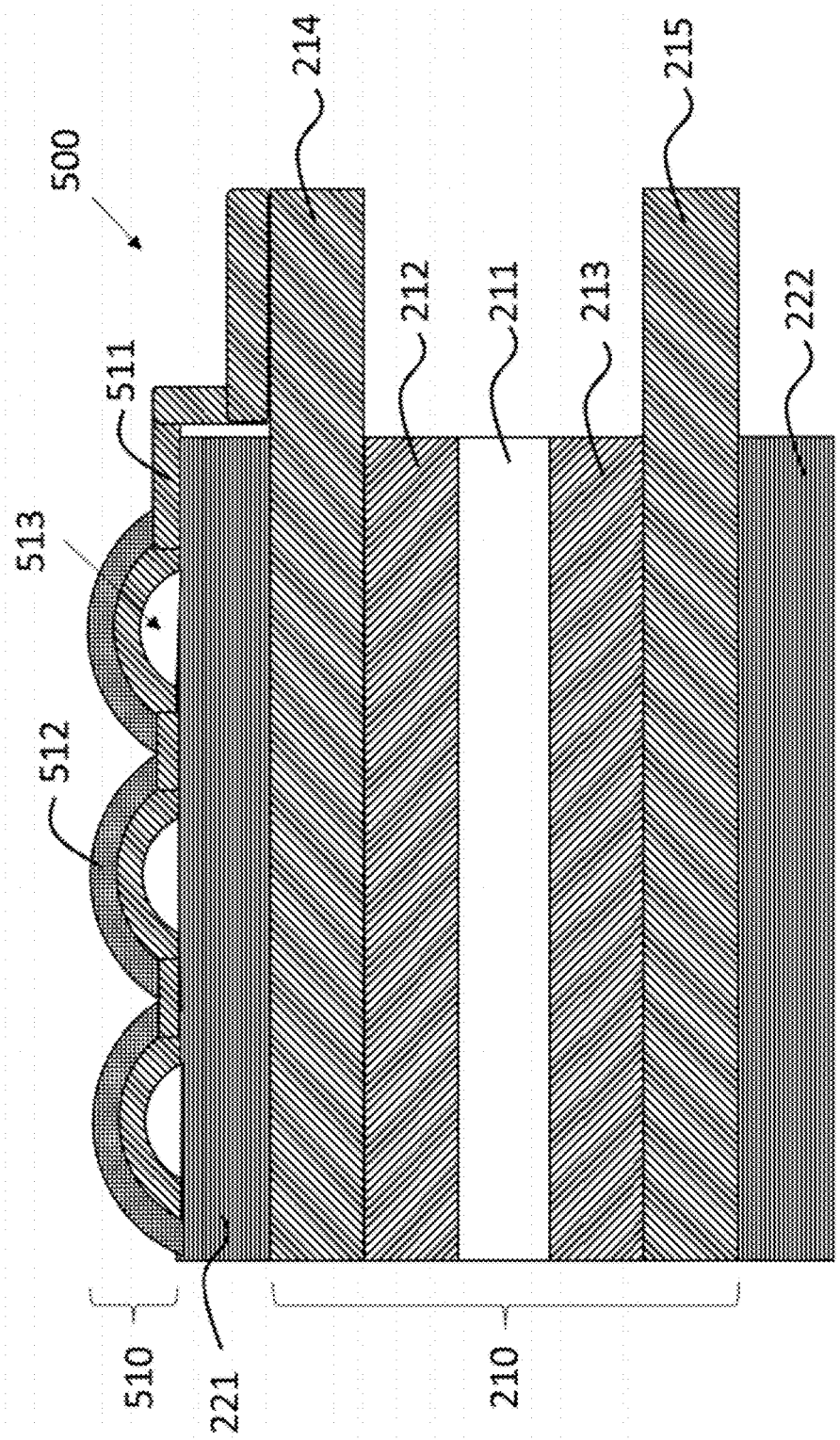
FIG. 5 is a schematic diagram depicting a cross section of an electric generator with a stereo-structured packaging layer according to certain embodiments.

FIG. 5 is a schematic diagram depicting a cross section of an electric generator with a stereo-structured packaging layer according to certain embodiments. The electric generator 500 is substantially similar to the electric generator 200 of FIG. 2A except that the electric generator 500 further comprises a stereo-structured packaging layer 510. The stereo-structured packaging layer 510 comprises a plurality of flexible concave electrodes 511 and a flexible polymer layer 512. Each flexible concave electrode 511 has a concave structure and partially covers a top surface of the first flexible triboelectric layer 221 in a way that empty space 513 is present between the concave flexible electrode and the top surface of the first flexible triboelectric layer 221. The flexible concave electrodes 511 also electrically connect to the first flexible electrode layer 214. The flexible polymer layer 512 covers the top surface of the flexible concave electrodes 511 and substantially conforms to the shape of the flexible concave electrodes 511. The flexible polymer layer 512 can provide mechanical support to the flexible concave electrodes 511 during bending.

Upon pressing to bend the stereo-structured packaging layer 510, triboelectric effect also comes from the contact and separation between the top surface of the first flexible triboelectric layer 221 and the bottom surface of the flexible concave electrodes 511 within the empty space 513. The stereo-structured packaging layer 510 allows the electric generator 500 to keep generating electric power even if a surface contact object (e.g., glove or sock) having zero or little electronegativity and inducing little or even no triboelectric effect is used.

In certain embodiments, the first flexible triboelectric layer and the flexible concave electrode have opposite electronegativity. In certain embodiments, the first flexible triboelectric layer has negative electronegativity and the flexible concave electrode have positive electronegativity. In certain embodiments, the first flexible triboelectric layer has positive electronegativity and the flexible concave electrode have negative electronegativity.

In certain embodiments, the flexible concave electrode comprises a conductive fabric, a conductive sponge, a metal foil, or a metal mesh.

In certain embodiments, the concave structure is an arch. The width of arch is in the range of 1.5 cm to 4.5 cm. The height of the arch depends on the force applied and lower height favors a smaller force. The height of arch is in the range of 0.3 mm to 5.0 mm. When a force applies onto the arch, an elastic deformation on the arch occurs, leading to contact and separation between the top surface of the flexible triboelectric layer and the bottom surface of the flexible concave electrode to generate electric power.

In certain embodiments, the polymer layer comprises silicone, polyimide, polyurethane, rubber, polyester, or nylon. In certain embodiments, the thickness of the polymer layer is in the range of 500 μm to 2000 μm.

Figure 6:
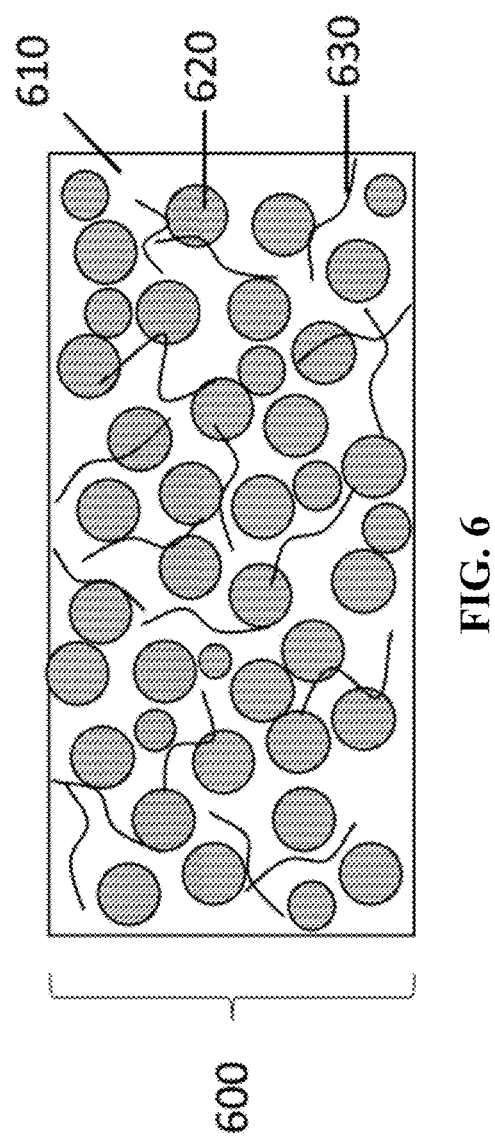
FIG. 6 is a schematic diagram depicting a cross section of a flexible piezoelectric layer according to certain embodiments.

FIG. 6 is a schematic diagram depicting a cross section of a flexible piezoelectric layer according to certain embodiments. The flexible piezoelectric layer 600 comprises a polymer matrix 610, inorganic piezoelectric ceramic powder 620, and electrical conducting materials 630.

Figure 7:
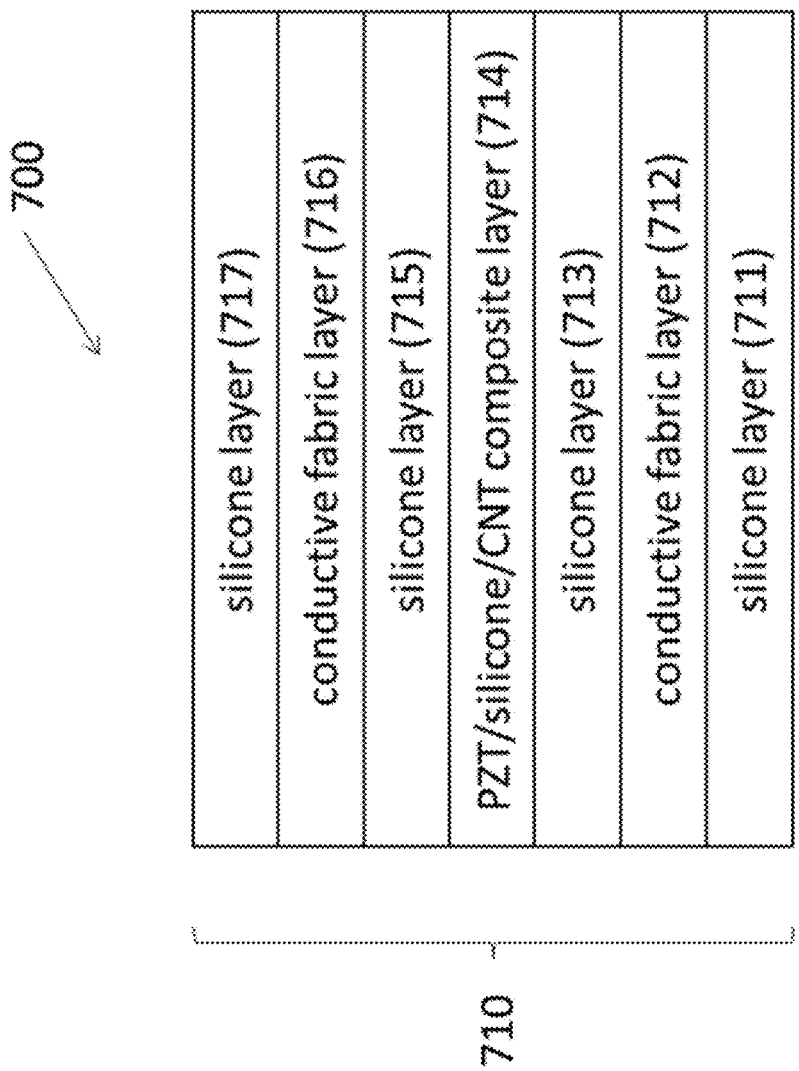
FIG. 7 is a schematic diagram depicting a cross section of a flexible electric generator with silicone layers according to certain embodiments.

FIG. 7 is a schematic diagram depicting a cross section of a flexible electric generator with silicone layers according to certain embodiments. The flexible electric generator 700 comprises a layer stack 710 having a plurality of layers. The layers are stacked in order starting from bottom to top as follows: a silicone layer 711, a conductive fabric layer 712, a silicone layer 713, a lead zirconate titanate (PZT)/silicone/carbon nanotube (CNT) composite layer 714, a silicone layer 715, a conductive fabric layer 716, and a silicone layer 717.

Figure 8:
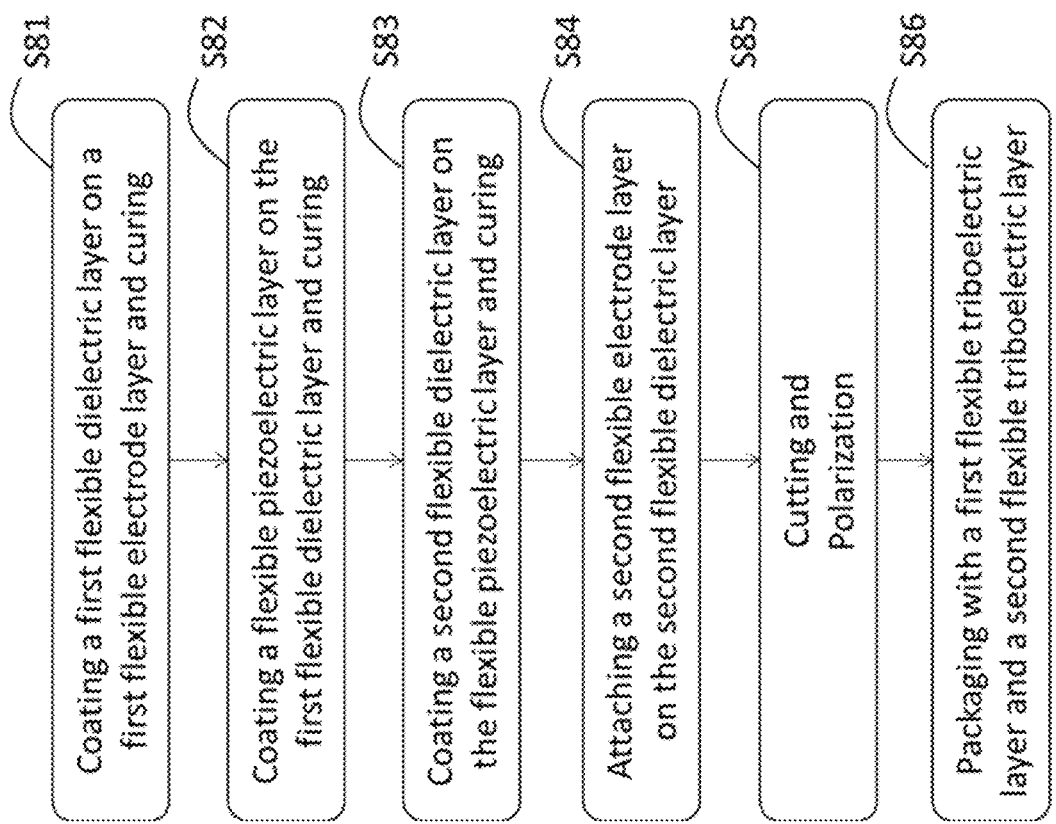
FIG. 8 is a flow chart depicting a fabrication method for fabricating an electric generator according to certain embodiments.

FIG. 8 is a flow chart depicting a fabrication method for fabricating an electric generator according to certain embodiments. In step S81, a first flexible dielectric layer is coated on a first flexible electrode layer to form a first layer stack and the first layer stack is cured. In step S82, a flexible piezoelectric layer is coated on the first flexible dielectric layer to from a second layer stack and the second layer stack is cured. In step S83, a second flexible dielectric layer is coated on the flexible piezoelectric layer to form a third layer stack and the third layer stack is cured. In step S84, a second flexible electrode layer is attached on the second flexible dielectric layer to form a fourth layer stack and the fourth layer stack is cured. In step S85, the fourth layer stack is cut and polarized to form a piezoelectric generator. In step S86, the piezoelectric generator is packaged with a first flexible triboelectric layer and a second flexible triboelectric layer.

Figure 9:
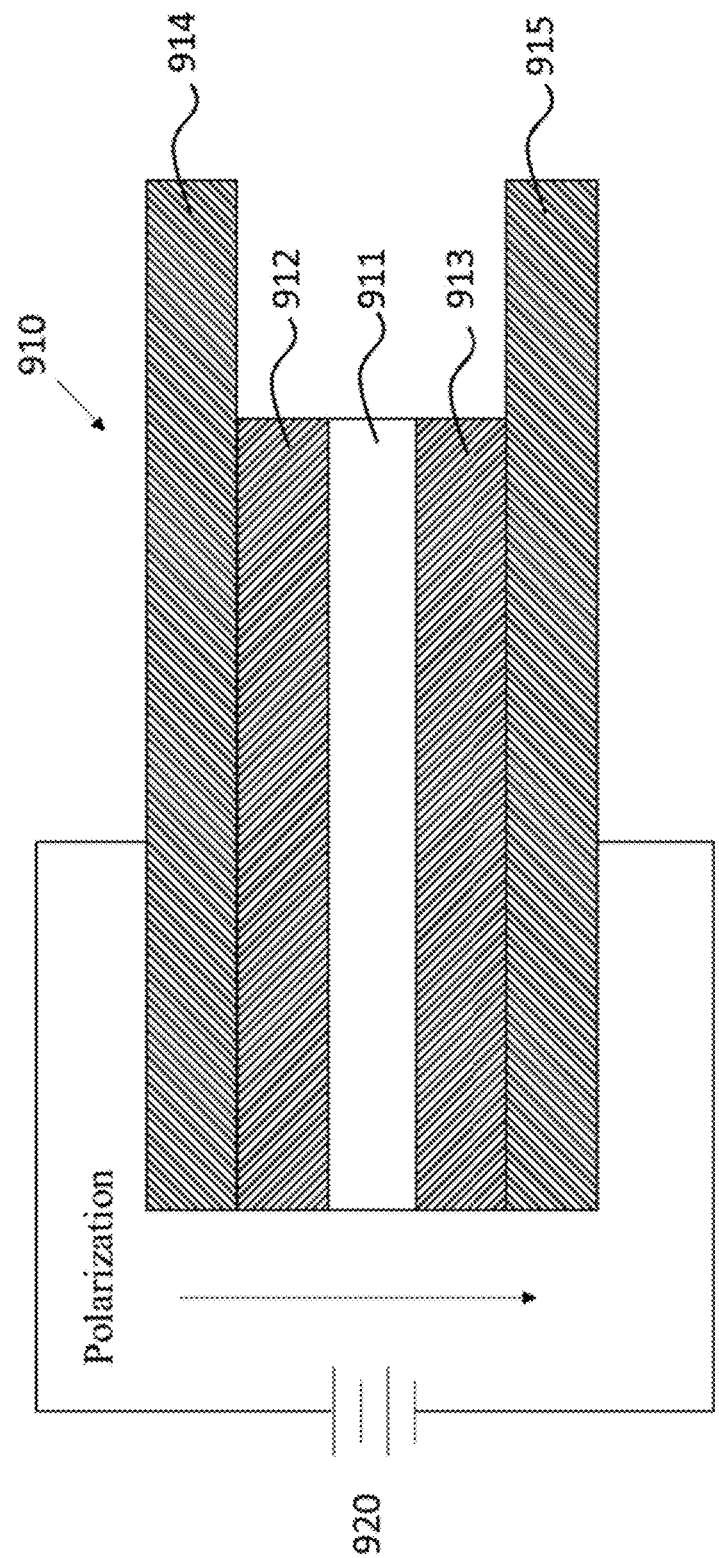
FIG. 9 is a schematic diagram depicting a polarization process for a piezoelectric layer according to certain embodiments.

FIG. 9 is a schematic diagram depicting a polarization process for a piezoelectric layer according to certain embodiments. A piezoelectric generator 910 comprises a flexible piezoelectric layer 911, a first flexible dielectric layer 912, a second flexible dielectric layer 913, a first flexible electrode layer 914 and a second flexible electrode layer 915. The first flexible electrode layer 914 and the second flexible electrode layer 915 are electrically connected to a direct current (DC) voltage generator 920 for generating DC voltage. By applying the DC voltage to the piezoelectric generator 910, the flexible piezoelectric layer 911 is polarized.

The present disclosure further provides a system for generating electric power. The system comprises the electric generator described above and a surface contact object for contacting the electric generator to generate electric power.

In certain embodiments, the flexible triboelectric layer has negative electronegativity and the surface contact object has positive electronegativity. In certain embodiments, the flexible triboelectric layer has positive electronegativity and the surface contact object has negative electronegativity.

In certain embodiments, the flexible triboelectric layer has a charge affinity value between −1 nC/J and −200 nC/J. In certain embodiments, the surface contact object has a charge affinity value between +3 nC/J and +60 nC/J.

In certain embodiments, the surface contact object is a metal tool, a plastic ball, or water drop.

Example 1

A flexible electric generator is prepared as follows. The flexible electric generator includes a flexible piezoelectric generator and two triboelectric layers. The flexible piezoelectric generator includes a piezoelectric composite layer, two dielectric layers, and two electrode layers. The materials of the piezoelectric composite layer includes PDMS with hardness of Shore A 20 degree (the weight ratio of PDMS component A (i.e., a base elastomer), to PDMS component B (i.e., a curing agent) is 1:1), 1150° C. calcined lead zirconate titanate powder with particle size ranging from 100 nm to 1 μm, and multi-walled carbon nanotubes. The weight ratio of lead zirconate titanate to the total composite is 50%. The weight ratio of multi-walled carbon nanotubes to the total composite is 0.5%. The thickness of the piezoelectric composite layer is 100 μm. The side length of piezoelectric composite layer is 5 cm.

The material of the two dielectric layers is PDMS with hardness of Shore A 20 degree. The thickness of the two dielectric layers is 100 μm. The two dielectric layers fully cover the piezoelectric composite layer respectively. The material of the two electrode layers is a conductive fabric. The conductive fabric is fabricated by polyester fiber deposited with nickel and copper. The thickness of the two electrode layers is 30 μm including back-sided electrical conductive acrylic glue thin film. The back-sided electrical conductive acrylic glue thin film is attached onto the dielectric layer. The sheet resistance of the two electrode layers is 0.02 ohm/square. The piezoelectric generator is conducted with polarization process with a DC voltage of 3.0 kV in ambient dry condition. The polarization temperature is 130 degree Celsius. The polarization duration is 20 min. The material of the two triboelectric layers is PDMS with hardness of Shore A 20 degree. The thickness of the two triboelectric layers is 100 μm. The side length of the two triboelectric layers is 5 cm.

By using bare hand tapping onto the flexible electric generator, the generated instantaneous mean root square current density is 0.5 μA/cm$^2$ and the generated instantaneous mean root square voltage density is 1.0 V/cm$^2$.

Example 2

The flexible electric generator of Example 2 is substantially similar to that of Example 1 except that this flexible electric generator further includes a partial flexible electrode. When the surface contact object is human bare skin, a partial flexible electrode can be added to improve the power generation performance. Similar to FIGS. 3A and 3B, the partial flexible electrode is located onto the top surface of the triboelectric layer and forms ohmic contact with the electrode layer using back-sided electrical conductive acrylic glue thin film. The purpose of the partial flexible electrode is efficiently collecting and exporting the power generated through triboelectric effect due to the fast surface contact and separation between human bare skin and the top surface of the triboelectric layer.

In this example, the material of the partial flexible electrode is a conductive fabric fabricated by polyester fiber deposited with nickel and copper. The generated instantaneous mean root square current density is 0.9 μA/cm$^2$ and the generated instantaneous mean root square voltage density is 1.6V/cm$^2$, when using bare hand fast tapping onto the flexible electric generator. It demonstrates that the generated power is substantially increased in the presence of the partial flexible electrode.

Example 3

The flexible electric generator of Example 3 is substantially similar to that of Example 1 except that one of the two triboelectric layers is replaced by a porous flexible triboelectric layer. To form the porous flexible triboelectric layer, a foaming agent, phenyltriethoxysilane with weight ratio of 2% is mixed into a silicone precursor. A porous structure is formed when curing the above at 100° C. for 20 min. The average diameter of the resulted bubbles is 100 μm. The thickness of the porous triboelectric layer is 150 μm. The side length of the porous triboelectric layer is 5 cm.

By using bare hand tapping onto the flexible electric generator, the generated instantaneous mean root square current density is 0.9 μA/cm$^2$ and the generated instantaneous mean root square voltage density is 1.8 V/cm$^2$. It demonstrates that the generated power is substantially increased by using the porous flexible triboelectric layer.

Example 4

The flexible electric generator of Example 4 is substantially similar to that of Example 1 except that this flexible electric generator further includes a stereo-structured packaging layer having two flexible concave electrodes and a polymer layer. The material of the flexible concave electrodes is a conductive fabric fabricated by polyester fiber deposited with nickel and copper. The thickness of the flexible concave electrodes is 30 μm including back-sided electrical conductive acrylic glue thin film. The flexible concave electrode partially covers the triboelectric layer using back-sided electrical conductive acrylic glue thin film for firming an arch structure. The arch structure has a width of 2.0 cm, a height of 1.0 mm and a length of 5.0 cm. The material of the polymer layer is silicone with the hardness of Shore A 20 degree. The thickness of the polymer layer is 1000 μm. The polymer layer with two of the arch structures is attached onto the top side of the flexible concave electrodes.

By using hand with nylon glove on and tapping onto the flexible electric generator, the generated instantaneous mean root square current density is 0.4 μA/cm$^2$ and the generated instantaneous mean root square voltage density is 0.6 V/cm$^2$. It demonstrates that the electric generator still functions when the surface contact object has zero electronegativity.

Example 5

A power generation test was conducted for a flexible electric generator with and without triboelectric effect. The flexible electric generator is prepared as follows.

A first flexible dielectric layer made by PDMS with hardness of Shore A 20 degree is coated on a first flexible electrode layer made by a flexible conductive fabric. The thickness of the flexible conductive fabric is 30 The thickness of the first dielectric layer is 100 The wet thin film is cured at 80 degree Celsius in an oven for 20 min. A flexible piezoelectric composite layer, composed of 10 g PDMS part A, 10 g PDMS part B, 20 g 1150 degree Celsius calcined PZT particles, with the weight ratio of multi-walled carbon nanotubes to PZT ranging from 0.1% to 1.8% is coated on the first flexible dielectric layer to form a second layer stack. The hardness of PDMS is Shore A 20 degree. The thickness of the wet piezoelectric composite film is 100 The wet film is cured at 80 degree Celsius in an oven for 20 min. A second flexible dielectric layer made by PDMS with hardness of Shore A 20 degree is coated on the flexible piezoelectric composite layer, the thickness of the second dielectric layer is 100 The wet film is cured at 80 degree Celsius in an oven for 20 min. A second flexible conductive fabric is attached on the top of second flexible dielectric layer by back-sided electric conductive acrylic glue thin film. The thickness of the flexible conductive fabric is 30 The stacked thin film is cut to a side length of 5 cm and then is polarized at 3 KV DC bias at 130 degree Celsius in an oven for 20 min to form as a piezoelectric generator. The protruding portion of the first and second flexible conductive fabric are made by attaching the conductive fabric with a thickness of 30 μm, a width of 0.8 cm and a length of 8.0 cm on each respectively, using back-sided electric conductive acrylic glue thin film. The piezoelectric generator is packaged with a first flexible triboelectric layer, made by PDMS with hardness of Shore A 20 degree. The thickness of the coated PDMS is 100 μm. The wet film is cured at 80 degree Celsius in an oven for 20 min. A second flexible triboelectric layer is made by PDMS with hardness of Shore A 20 degree. The thickness of the coated PDMS is 100 μm. The wet film is cured at 80 degree Celsius in an oven for 20 min. A partial flexible electrode, made by a flexible conductive fabric, with a thickness of 30 μm, width of 0.8 cm and a length of 8.0 cm, is attached on the top of the first flexible triboelectric layer by back-sided electric conductive acrylic glue thin film. Ohmic contact is formed between the partial flexible electrode and the first flexible electrode layer. Two probes of a multimeter are connected to the protruding portions of the first and second flexible electrode layers respectively to test the generated current and voltage. The partial flexible electrode and the first and second flexible triboelectric layers are removed to test the generated current and voltage again.

Figures 10A, 10B:
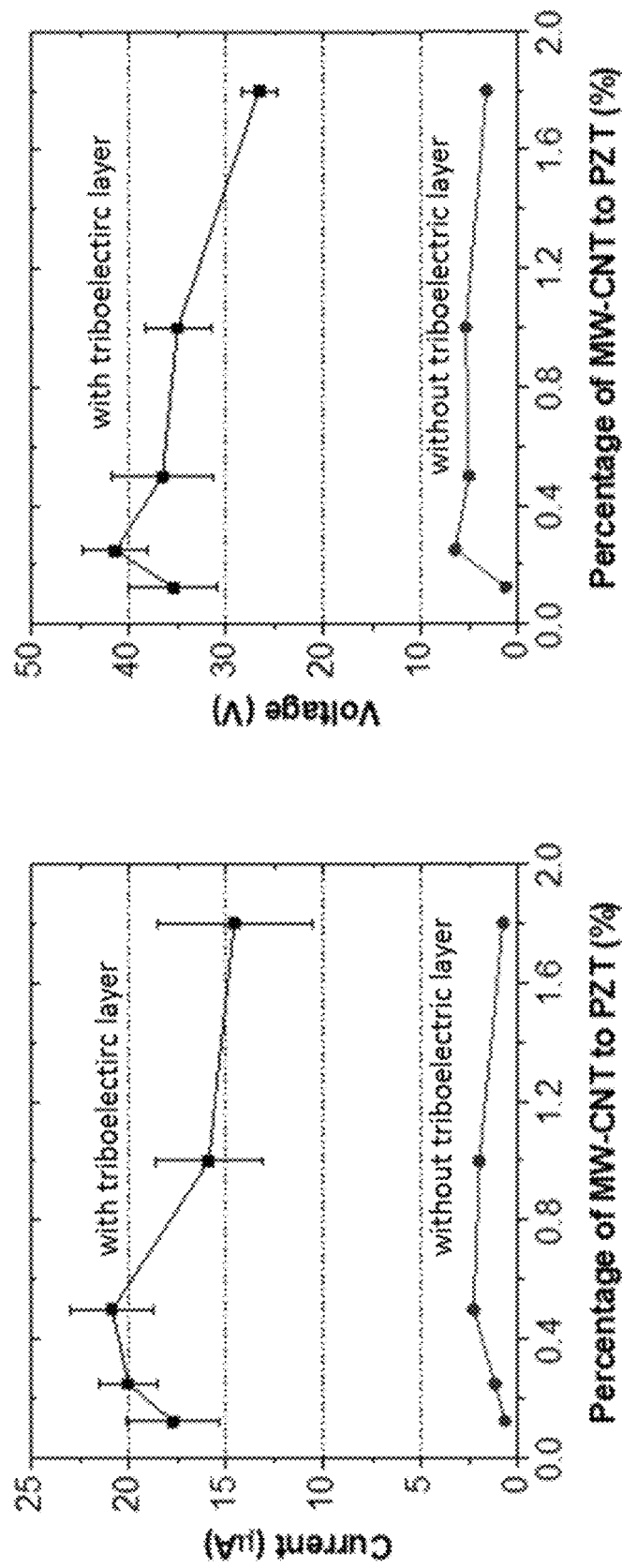
FIG. 10A is a plot showing the generated current of flexible electric generators with and without triboelectric layers according to certain embodiments.
FIG. 10B is a plot showing the generated voltage of the flexible electric generators with and without triboelectric layers.

The generated voltage and current of the flexible electric generators with and without the triboelectric layers were measured. As shown in FIGS. 10A and 10B, by combining with triboelectric effect, the generated current and voltage of the flexible electric generator with the triboelectric layer is increased more than 5 times.

Example 6

A reliability test under bending was conducted for a flexible electric generator. The flexible electric generator is prepared as follows.

A first flexible dielectric layer made by PDMS with hardness of Shore A 20 degree is coated on a first flexible electrode layer made by a flexible conductive fabric. The thickness of the flexible conductive fabric is 30 μm. The thickness of the first dielectric layer is 100 μm. The wet thin film is cured at 80 degree Celsius in an oven for 20 min. A flexible piezoelectric composite layer, composed of 10 g PDMS part A, 10 g PDMS part B, 20 g 1150 degree Celsius calcined PZT particles, with the weight ratio of multi-walled carbon nanotubes to PZT ranging from 0.1% to 1.8% is coated on the first flexible dielectric layer to form a second layer stack. The hardness of PDMS is Shore A 20 degree. The thickness of the wet piezoelectric composite film is 100 The wet film is cured at 80 degree Celsius in an oven for 20 min. A second flexible dielectric layer made by PDMS with hardness of Shore A 20 degree is coated on the flexible piezoelectric composite layer, the thickness of the second dielectric layer is 100 The wet film is cured at 80 degree Celsius in an oven for 20 min. A second flexible conductive fabric is attached on the top of second flexible dielectric layer by back-sided electric conductive acrylic glue thin film. The thickness of the flexible conductive fabric is 30 The stacked thin film is cut to a side length of 5 cm and then is polarized at 3 KV DC bias at 130 degree Celsius in an oven for 20 min to form as a piezoelectric generator. The protruding portion of the first and second flexible conductive fabric are made by attaching the conductive fabric with a thickness of 30 μm, a width of 0.8 cm and a length of 8.0 cm on each respectively, using back-sided electric conductive acrylic glue thin film. The piezoelectric generator is packaged with a first flexible triboelectric layer, made by PDMS with hardness of Shore A 20 degree. The thickness of the coated PDMS is 100 The wet film is cured at 80 degree Celsius in an oven for 20 min. A second flexible triboelectric layer is made by PDMS with hardness of Shore A 20 degree. The thickness of the coated PDMS is 100 The wet film is cured at 80 degree Celsius in an oven for 20 min. Both sides of the stacked thin film are clamped to conduct the bending test.

Figure 11:
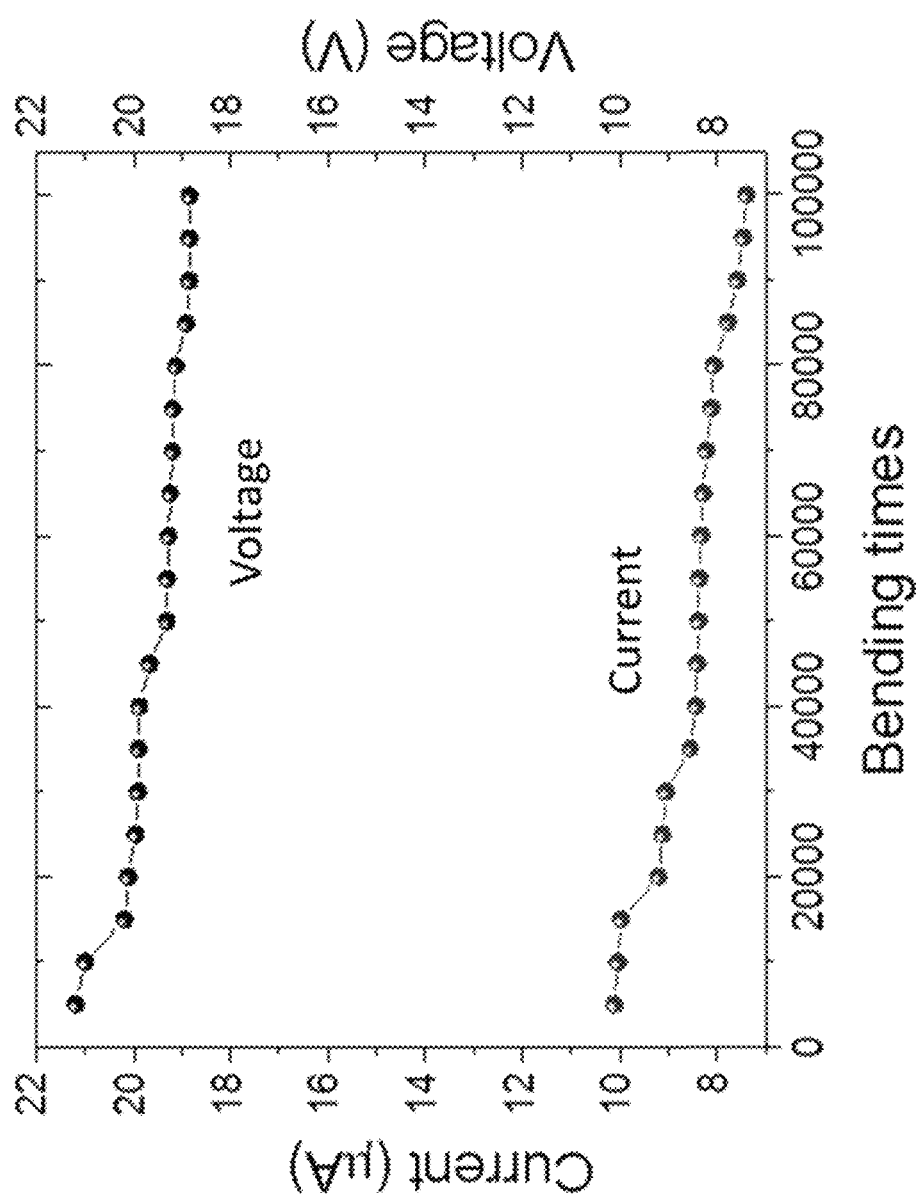
FIG. 11 is a plot showing decay curves of the generated voltage and current of a flexible electric generator under different bending cycles according to certain embodiments.

The flexible electric generator was bent for 100,000 cycles. The generated voltage and current of the flexible electric generators were measured under different bending cycles. As shown in FIG. 11, after 100,000 bending cycles, the generated current of the flexible electric generator is merely dropped from 10 μA to 7.2 μA with 72% retention, and the generated voltage of the flexible electric generator are only dropped from 21 V to 19 V with 90% retention. It demonstrates that the flexible electric generator provides high reliability under bending and the layers of the flexible electric generator are well protected by the triboelectric layers for avoiding peeling of the stacked layers.

Thus, it can be seen that the improved electric generators have been disclosed which eliminates or at least diminishes the disadvantages and problems associated with prior art devices and processes. In accordance with certain embodiments, the flexible electric generator comprises a flexible triboelectric layer covering the electrode layer of a flexible piezoelectric generator that provides higher output power by combining piezoelectric effect and triboelectric effect. The reliability of the electric generator under bending is also improved due to the presence of the flexible triboelectric layer. The fabrication methods of the disclosed flexible electric generators are simple, thereby enabling large-scale manufacturing.

The electric generators of the present disclosure can be used as an electric power source or a force sensor. In particular, due to their superior flexibility and reliability, the present electric generators can be used in wearable electronic devices, e.g., integrating them into fabrics or clothes for driving wearable electronic devices.

Although the invention has been described in terms of certain embodiments, other embodiments apparent to those of ordinary skill in the art are also within the scope of this invention. Accordingly, the scope of the invention is intended to be defined only by the claims which follow.

What is claimed is:

1. An electric generator comprising:
   a piezoelectric generator comprising:
      a flexible piezoelectric layer for generating a first electric power via piezoelectric effect under contact between the electric generator and a first surface contact object and/or a second surface contact object;
      a first flexible dielectric layer having a bottom surface partially or fully covering a top surface of the flexible piezoelectric layer;
      a second flexible dielectric layer having a top surface partially or fully covering a bottom surface of the flexible piezoelectric layer;
      a first flexible electrode layer comprising a first covering portion having a bottom surface partially or fully covering a top surface of the first flexible dielectric layer; and
      a second flexible electrode layer comprising a second covering portion having a top surface partially or fully covering a bottom surface of the second flexible dielectric layer;
   a first flexible triboelectric layer having a bottom surface partially or fully covering a top surface of the first covering portion of the first flexible electrode layer for generating a second electric power via triboelectric effect under contact and separation between a top surface of the first flexible triboelectric layer and the first surface contact object; and
   a second flexible triboelectric layer having a top surface partially or fully covering a bottom surface of the second covering portion of the second flexible electrode layer for generating a third electric power via triboelectric effect under contact and separation between a bottom surface of the second flexible triboelectric layer and the second surface contact object.

2. The electric generator of claim 1, wherein the first and second flexible triboelectric layers have negative electronegativity.

3. The electric generator of claim 1, wherein the first and second flexible triboelectric layers have a charge affinity value between −1 nC/J and −200 nC/J.

4. The electric generator of claim 1, wherein the flexible piezoelectric layer comprises a polymer matrix, an inorganic piezoelectric material and an electrical conducting material.

5. The electric generator of claim 1, wherein each of the first flexible dielectric layer and the second flexible dielectric layer comprises silicone.

6. The electric generator of claim 1, wherein the first flexible electrode layer further comprises a first protruding portion protruding from the top surface of the first flexible dielectric layer for providing a first ohmic contact to a load, the second flexible electrode layer further comprises a second protruding portion protruding from the bottom surface of the second flexible dielectric layer for providing a second ohmic contact to the load.

7. The electric generator of claim 1, wherein each of the first flexible electrode layer and the second flexible electrode layer comprises a conductive fabric, a conductive sponge, a metal foil, or a metal mesh.

8. The electric generator of claim 1, wherein each of the first and second flexible triboelectric layers comprises a polymer, an electrostatic textile, or a cellulose-based material.

9. The electric generator of claim 8, wherein the polymer is silicone, polyimide, polyurethane, rubber, polyester, or nylon, the electrostatic textile is an electrostatic fabric, or an electrostatic cloth, the cellulose-based material is a paper.

10. The electric generator of claim 1, wherein the first and second flexible triboelectric layers are porous.

11. The electric generator of claim 10, wherein the first flexible triboelectric layer has porosity between 10% and 80%, each pore of the first flexible triboelectric layer has a diameter between 0.1 μm and 100 μm.

12. The electric generator of claim 1 further comprising a partial flexible electrode partially covering a top surface of the first flexible triboelectric layer.

13. The electric generator of claim 12, wherein the partial flexible electrode covers an area between 1% and 50% of a total area of the top surface of the first flexible triboelectric layer.

14. The electric generator of claim 1 further comprising a stereo-structured packaging layer comprising one or more concave flexible electrodes, each of the one or more concave flexible electrodes partially covering the top surface of the first flexible triboelectric layer in a way that empty space is present between each of the one or more concave flexible electrodes and the first flexible triboelectric layer.

15. The electric generator of claim 14, wherein the empty space has a height between 0.3 mm and 5.0 mm.

16. The electric generator of claim 14, wherein the stereo-structured packaging layer further comprises a polymer layer covering the top surface of each of the one or more concave flexible electrodes.

17. A system for generating electric power comprising:
   the electric generator of claim 1; and
   one or more surface contact objects for contacting the electric generator to generate electric power.

18. The system of claim 17, wherein the first and second flexible triboelectric layers have negative electronegativity, the one or more surface contact objects have positive electronegativity.

19. The system of claim 17, wherein the first and second flexible triboelectric layers have a charge affinity value between −1 nC/J and −200 nC/J, the one or more surface contact objects have a charge affinity value between +3 nC/J and +60 nC/J.

* * * * *